(12) United States Patent
Tseng et al.

(10) Patent No.: US 10,756,050 B2
(45) Date of Patent: Aug. 25, 2020

(54) PACKAGE STRUCTURE AND BONDING METHOD THEREOF

(71) Applicant: Unimicron Technology Corp., Taoyuan (TW)

(72) Inventors: Tzyy-Jang Tseng, Taoyuan (TW); Cheng-Ta Ko, Taipei (TW); Kai-Ming Yang, Taoyuan (TW); Yu-Hua Chen, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/152,424

(22) Filed: Oct. 5, 2018

(65) Prior Publication Data

US 2020/0043890 A1 Feb. 6, 2020

(30) Foreign Application Priority Data

Aug. 3, 2018 (TW) .............................. 107127118 A

(51) Int. Cl.
*H01L 29/40* (2006.01)
*H01L 23/00* (2006.01)
(Continued)

(52) U.S. Cl.
CPC ............ *H01L 24/92* (2013.01); *H01L 21/481* (2013.01); *H01L 21/4846* (2013.01);
(Continued)

(58) Field of Classification Search
CPC . H01L 21/481; H01L 21/4846; H01L 21/563; H01L 21/76832; H01L 2224/02331; H01L 2224/0361; H01L 2224/0401; H01L 2224/05558; H01L 2224/05573; H01L 2224/16227; H01L 2224/16237; H01L 2224/2957; H01L 2224/2969; H01L 2224/32225; H01L 2224/73203; H01L 2224/81898;
(Continued)

(56) References Cited

U.S. PATENT DOCUMENTS 7,019,391 B2  3/2006  Tran
8,421,225 B2  4/2013  Ramanathan et al.
(Continued)

FOREIGN PATENT DOCUMENTS

| TW | I253697   | 4/2006 |
| TW | 200938023 | 9/2009 |
| TW | 201202846 | 1/2012 |

OTHER PUBLICATIONS

Office Action of Taiwan Counterpart Application, dated Feb. 20, 2019, pp. 1-7.

*Primary Examiner* — Robert G Bachner
(74) *Attorney, Agent, or Firm* — JCIPRNET

(57) ABSTRACT

A package structure includes a first substrate, a second substrate, a plurality of conductive pillars and an adhesive layer. The first substrate includes a plurality of vias and a plurality of pads. The pads are disposed on the first substrate, and fill the vias. The second substrate is disposed opposite to the first substrate. Each conductive pillar electrically connects each pad and the second substrate, and the adhesive layer fills the gaps between the conductive pillars. A bonding method of the package structure is also provided.

10 Claims, 7 Drawing Sheets

(51) Int. Cl.
 *H01L 21/48* (2006.01)
 *H01L 23/498* (2006.01)
(52) U.S. Cl.
 CPC ........ *H01L 23/49838* (2013.01); *H01L 24/05* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 2224/02331* (2013.01); *H01L 2224/0401* (2013.01); *H01L 2224/05558* (2013.01); *H01L 2224/05573* (2013.01); *H01L 2224/16227* (2013.01); *H01L 2224/16237* (2013.01); *H01L 2224/2957* (2013.01); *H01L 2224/2969* (2013.01); *H01L 2224/32225* (2013.01); *H01L 2224/73203* (2013.01); *H01L 2224/81898* (2013.01); *H01L 2224/8385* (2013.01); *H01L 2224/9211* (2013.01); *H01L 2924/20105* (2013.01)
(58) Field of Classification Search
 CPC ..... H01L 2224/8385; H01L 2224/9211; H01L 23/145; H01L 23/488; H01L 23/49811; H01L 23/49822; H01L 23/49833; H01L 23/49838; H01L 23/522; H01L 24/02; H01L 24/05; H01L 24/13; H01L 24/16; H01L 24/29; H01L 24/32; H01L 24/73; H01L 24/81; H01L 24/83; H01L 24/92; H01L 2924/201; H01L 2924/20105; H05K 2203/0384; H05K 3/32; H05K 3/40; H05K 3/4644
 See application file for complete search history.

(56) References Cited

U.S. PATENT DOCUMENTS

2006/0060765 A1    3/2006  Huang
2013/0193567 A1*   8/2013  Miyao ................. H01L 21/4842
                                                                257/676
2014/0306241 A1*  10/2014  Hirakata ............. H01L 51/5281
                                                                 257/79
2015/0187734 A1*   7/2015  Liu .................... H01L 25/0657
                                                                257/621

\* cited by examiner

PACKAGE STRUCTURE AND BONDING METHOD THEREOF

CROSS REFERENCE TO RELATED APPLICATION

This application claims the priority benefit of Taiwan application serial no. 107127118, filed on Aug. 3, 2018. The entirety of the above-mentioned patent application is hereby incorporated by reference herein and made a part of specification.

BACKGROUND

Technical Field

The invention relates to a packaging technique, and more particularly, to a package structure and a bonding method of a package structure.

Description of Related Art

With the evolution of semiconductor packaging technology, different package types have been developed for semiconductor devices, such as wire bonding, flip chip or hybrid (i.e., flip chip together with wire bonding) packaging techniques. However, the above bonding techniques with use of a solder balls may encounter problems like bonding surface separation due to long-term fatigue, reliability issue caused by the defective solder during the manufacturing process, and relatively high resistance on contact points.

Currently, a chip packaging technique using a copper structure for bonding has been developed to conduct bonding between chip and package carrier in a press-fitting manner. Nonetheless, implementation conditions for achieving the existing copper requires the temperature of 300° C. to 450° C. with the pressure up to 300 MPa, and an annealing process after bonding. In addition, because the surface of the copper structure needs to be well cleaned for obtaining a flat surface through a chemical polishing process (CMP) before bonding, the manufacturing process is complicated so manufacturing cost cannot be reduced. Moreover, the underfill used after bonding for reducing the size of the package structure and refining the contact points may not be able to reliably cover the contact points each time such that quality and reliability for bonding may be reduced accordingly.

SUMMARY

The invention provides a package structure, which is suitable for a low temperature bonding assembly and has favorable bonding strength and bonding quality.

The invention provides a bonding method of a package structure, which is suitable for reducing process requirements, reducing manufacturing cost and improving quality and reliability of the package structure.

The package structure of the invention includes a first substrate, a second substrate, a plurality of conductive pillars and an adhesive layer. The first substrate includes a plurality of vias and a plurality of pads. The pads are disposed on the first substrate and fill the vias. The second substrate is disposed opposite to the first substrate. Each of the conductive pillars electrically connects the pads and the second substrate. Each of the conductive pillars fills each of the vias. The adhesive layer is disposed between the first substrate and the second substrate. The adhesive layer fills gaps between the conductive pillars.

In an embodiment of the invention, each of the pads is conformal with each of the vias.

In an embodiment of the invention, each of the pads has a dimple, and each of the conductive pillars electrically connects each of the dimples.

In an embodiment of the invention, the adhesive layer includes one of a non-photosensitive adhesive or a photosensitive adhesive.

In an embodiment of the invention, the package structure further includes a planarization layer and a macromolecular adhesive layer. The planarization layer is disposed on the second substrate, and the planarization layer is located between the second substrate and the conductive pillars. The macromolecular adhesive layer is disposed on the adhesive layer and fills the gaps between the conductive pillars.

The bonding method of the package structure includes the following steps. A first substrate is provided, and a plurality of vias are formed in the first substrate. A plurality of pads are disposed on the first substrate, and each of the pads fills each of the vias. A second substrate is provided, and a plurality of conductive pillars are formed on the second substrate. An adhesive layer is disposed between the first substrate and the second substrate, and the adhesive layer fills gaps between the conductive pillars. Further, the conductive pillars are press-fitted to the pads such that each of the conductive pillars electrically connects each of the pads and fills the each of the vias.

In an embodiment of the invention, the step of forming the vias in the first substrate includes providing a first base and forming a dielectric material in the first base. Further, the dielectric material is patterned to form a dielectric layer having the vias, and a portion of the first base is exposed.

In an embodiment of the invention, the step of disposing the pads on the first substrate includes forming a metal interfacial layer on the dielectric layer filling the vias. A patterned passivation layer covering the metal interfacial layer is formed, and a portion of the metal interfacial layer filling the vias is exposed. The pads are formed from the portion of the metal interfacial layer being exposed. Further, the patterned passivation layer and the metal interfacial layer covered by the patterned passivation layer are removed.

In an embodiment of the invention, the bonding method of the package structure further includes forming a dimple on each of the pads, where each of the conductive pillars electrically connects each of the dimples.

In an embodiment of the invention, the bonding method of the package structure further includes disposing a planarization layer on the second substrate, where the planar layer is located between the second substrate and the conductive pillars. Further, a macromolecular adhesive layer is disposed on the adhesive layer, where the macromolecular adhesive layer fills the gaps between the conductive pillars.

Based on the above, with the package structure and the bonding method thereof according to the invention, the adhesive layer may be disposed between the first substrate and the second substrate before press-fitting the first substrate to the second substrate. After bonding, the adhesive layer may fill the gaps between the first substrate and the second substrate and fill the gaps between the conductive pillars. Accordingly, sealing protection, favorable bonding strength and bonding quality may be achieved under the premise of refining the contact points. Moreover, during bonding, because a stress concentrator may be produced between the conductive pillar and the pad in contact, process temperature and pressure for bonding may be effectively reduced to be suitable for the low temperature bonding assembly. In comparison with the conventional bonding technique, the bonding method of the package structure of the invention is suitable for reducing process requirements, reducing manufacturing cost and improving quality and reliability of the package structure. Further, the conductive pillars can fill the vias and achieve favorable electrical connection with the pads to allow the package structure to provide favorable electrical property that further improves quality of the package structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
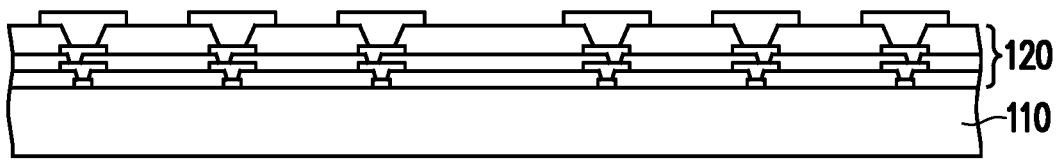
FIG. 1A to FIG. 1H are cross-sectional views illustrating a manufacturing process of a first substrate in the bonding method of the package structure according to an embodiment of the invention.

Some embodiments are provided hereinafter and described in detail with reference to the accompanied drawings. However, the embodiments provided are not intended to limit the scope of the invention. Further, the drawings are only descriptive and are not drawn to scale. For ease of explanation, the same devices below are provided with the same reference numerals.

Moreover, terms such as "first" and "second" used herein do not represent sequence or order, and it should be understood that they are only for differentiating devices or operations having the same technical terms.

Furthermore, terms such as "contain", "include", and "have" used herein are all open terms, i.e., contains, but not limited to.

In addition, terms such as "contacted", "connected", and "bonded" used herein refer to a direction contact or indirect contact through other film layers unless otherwise stated.

Figure 1B:
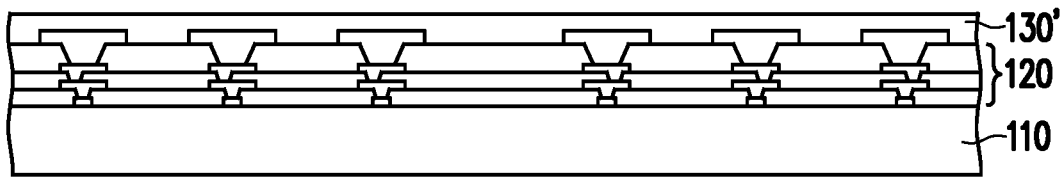
Figure 1C:
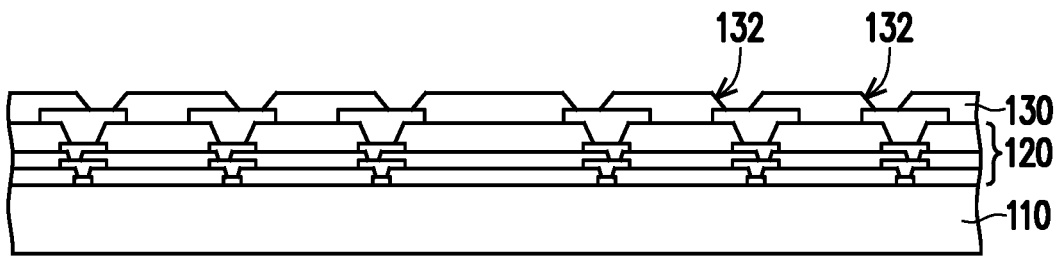
Figure 1D:
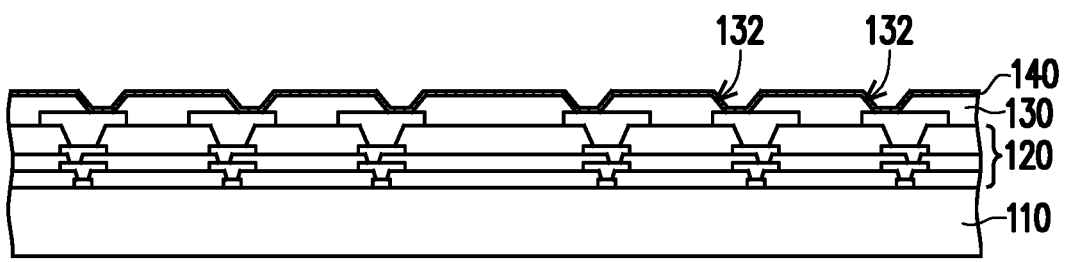

FIG. 1A to FIG. 1H are cross-sectional views illustrating a manufacturing process of a first substrate in the bonding method of the package structure according to an embodiment of the invention. With reference to FIG. 1A to FIG. 1C, in this embodiment, a first substrate 100 is provided, and a plurality of vias 132 are then formed in the first substrate 100 (as illustrated in FIG. 1C). In detail, with reference to FIG. 1A, the step in which the vias 132 are formed in the first substrate 100 includes providing a first base 110. The first base 110 may be made of glass, ceramic, polymeric material or silicon, such as poly-silicon, silicon carbide (SiC), graphene, aluminium nitride (AlN) or other suitable materials, but not limited thereto.

In this embodiment, the first substrate 100 is, for example, a circuit carrier having a circuit layer 120. For instance, the circuit layer 120 is disposed on the first base 110. As shown by FIG. 1A, the circuit layer 120 is, for example, a redistribution circuit layer formed by multiple stacked layers. The redistribution circuit layer may be a multiple-layer circuit composed of an insulation layer, two patterned circuits disposed on two opposite sides of the insulation layer and conductive holes penetrating the insulation layer and communicating through the two patterned circuits, and may also be a single layer circuit or a multiple-layer circuit formed by other methods, which are not particularly limited by the invention. In other embodiments, the first substrate 100 may also be a carrier not having the circuit layer.

Next, with reference to FIG. 1B, a dielectric material 130' is formed on the first base 110. The dielectric material 130' includes an inorganic material (e.g., silicon oxide, silicon nitride, silicon oxynitride or other suitable materials, or a stacked layer of at least two of the above materials), an organic material (e.g., polyimide (PT), polybenzoazole (PBO), silicone, epoxy, benzocyclobutene (BCB), or other suitable materials, or a stacked layer of at least two of the above materials), or other suitable materials or a combination of the above.

Next, with reference to FIG. 1C, the dielectric material 130' is patterned to form a dielectric layer 130 having the vias 132. For instance, a patterned masking layer (not illustrated) is formed on the dielectric material 130'. Subsequently, a photolithography process is performed with the patterned masking layer as the mask to form the vias 132 in the dielectric layer 130. The vias 132 expose a surface of a portion of the first base 110.

Figure 1E:
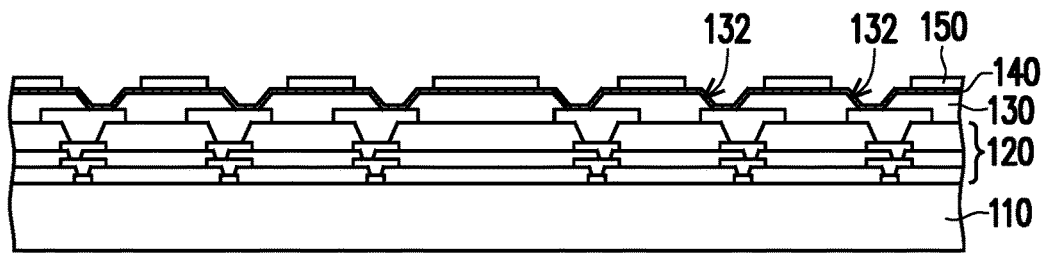
Figure 1F:
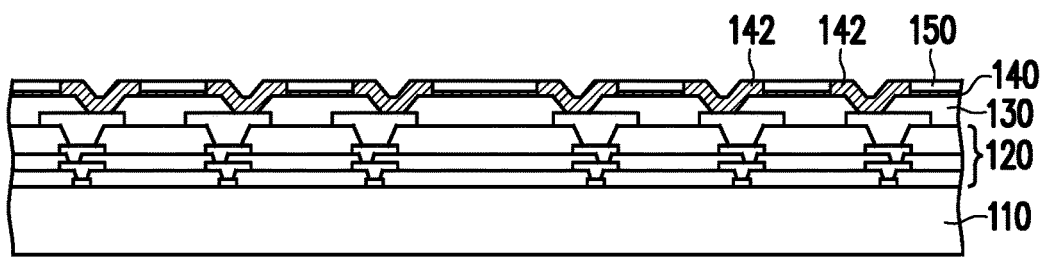
Figure 1G:
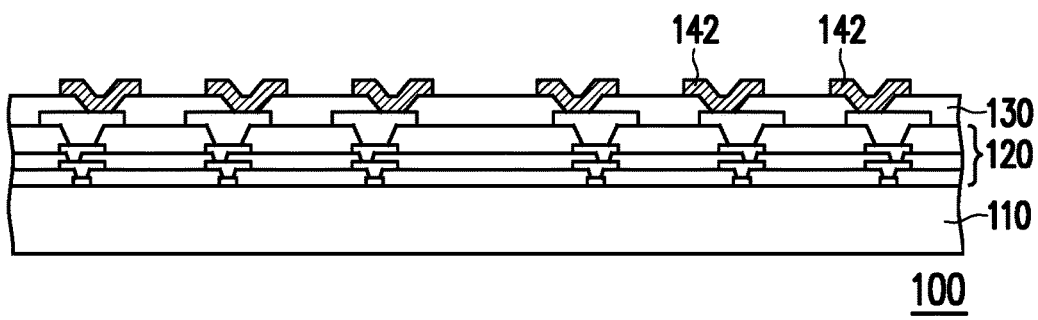

Then, with reference to FIG. 1G, a plurality of pads 142 are formed on the first substrate 100 and each of the pads 142 fills each of the vias 132. In detail, the step in which the pads 142 are disposed on the first substrate 100 includes the follow steps. First, with reference to FIG. 1D, a metal interfacial layer 140 is formed on the patterned dielectric layer 130 and filled in the vias 132. The metal interfacial layer 140 can conformally cover the patterned dielectric layer 130. In this embodiment, the metal interfacial layer 140 may be a seed layer made of a metal material, a metal nitride, a metal silicide, or a combination thereof. The metal material may be, for example, titanium, copper, nickel, palladium, gold, silver or alloys thereof, but the invention is not limited thereto. A method of forming the metal interfacial layer 140 includes a physical vapor deposition, a chemical vapor deposition, an electroplating process or a chemical plating process. The physical vapor deposition may be, for example, a sputtering deposition or a vapor deposition, but the invention is not limited thereto.

Next, with reference to FIG. 1E, a patterned passivation layer 150 covering the metal interfacial layer 140 is formed. In detail, a passivation material (not illustrated) is formed on the metal interfacial layer 140. Afterwards, a patterned masking layer (not illustrated) is formed on the passivation material. Then, a photolithography process is performed with the patterned masking layer as the mask to pattern the passivation material to form the patterned passivation layer. In this embodiment, the patterned passivation layer150 exposes a portion of the metal interfacial layer 140 filling the vias 132. However, the invention is not limited to the above, but may be adjusted by users based on design requirements. The patterned passivation layer 150 may be made of a photosensitive material, polyimide, or polybenzoxazole (PBO),silicone, epoxy, benzocyclobutene (BCB), or other suitable materials, or a combination of the above, which are not particularly limited by the invention.

In other embodiments, the passivation material may be directly patterned without using the patterned masking layer. For example, a photoimageable dielectric (PID) material may be used as a patterned passivation material so the patterned passivation layer 150 can be formed through exposure and development.

Afterwards, with reference to FIG. 1F, the patterned masking layer may be removed first, and the electroplating process or the chemical plating process may then be performed to form the pads 142 from the portion of the metal interfacial layer 140 being exposed. In this embodiment, the pads 142 and the metal interfacial layer 140 are made of the same metal that includes a metal material. The metal material may be, for example, titanium, copper, nickel, palladium, gold, silver or alloys thereof. Incidentally, after the pads 142 are formed, the metal interfacial layer 140 may be regarded as a portion of the pad 142. Therefore, the metal interfacial layer 140 exposed by the patterned passivation layer 150 is not illustrated in FIG. 1F.

Then, with reference to FIG. 1G, the patterned passivation layer 150 and the metal interfacial layer 140 covered by the patterned passivation layer 150 are removed. In this embodiment, the method of removing the pattered passivation layer 150 includes peeling or ashing processes. The ashing process includes a plasma ashing process, but the invention is not limited thereto. The method of removing the metal interfacial layer 140 includes an etching process, and the etching process includes a wet-etching process. The wet-etching process may use, for example, hydrofluoric acid (HF), diluted hydrofluoric acid (DHF) or buffer oxidizing etchant (BOE), but the invention is not limited thereto. So far, the fabrication of the first substrate 100 has been substantially completed.

Figure 1H:
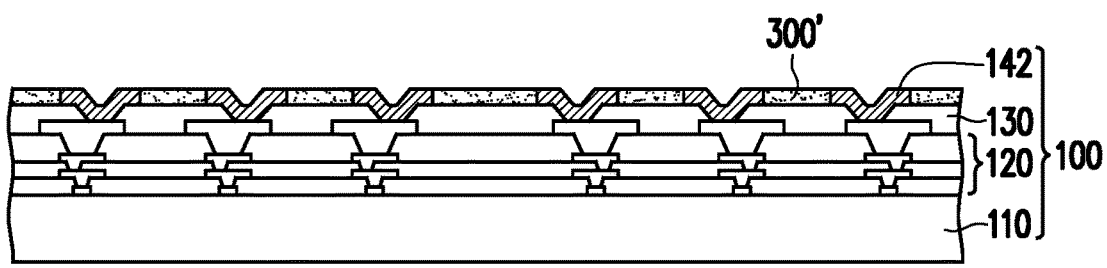

In other embodiments, an adhesive layer 300' may be selectively disposed on the completed first substrate 100. With reference to FIGS. 1G and 1H, in this embodiment, after the fabrication of the first substrate 100, the adhesive layer 300' may be disposed on the dielectric layer 130 surrounding the pads 142. Specifically, instead of covering the pads 142, the adhesive layer 300' is located in gaps between the pads 142. With the above design, the adhesive layer 300' may fill between the pads 142 before the subsequent press-fitting process to provide favorable protection for the pads 142 and provide favorable bonding strength and reliability so as to satisfy the requirement for refining the contact points.

Figure 2A:
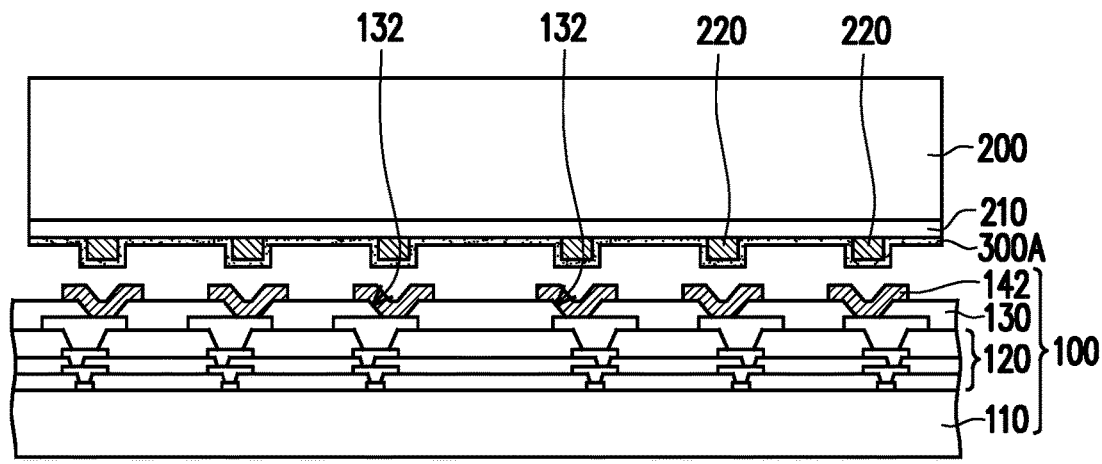
FIG. 2A and FIG. 2B are cross-sectional views illustrating a press-fitting process in the bonding method of the package structure according to an embodiment of the invention.
Figure 2B:
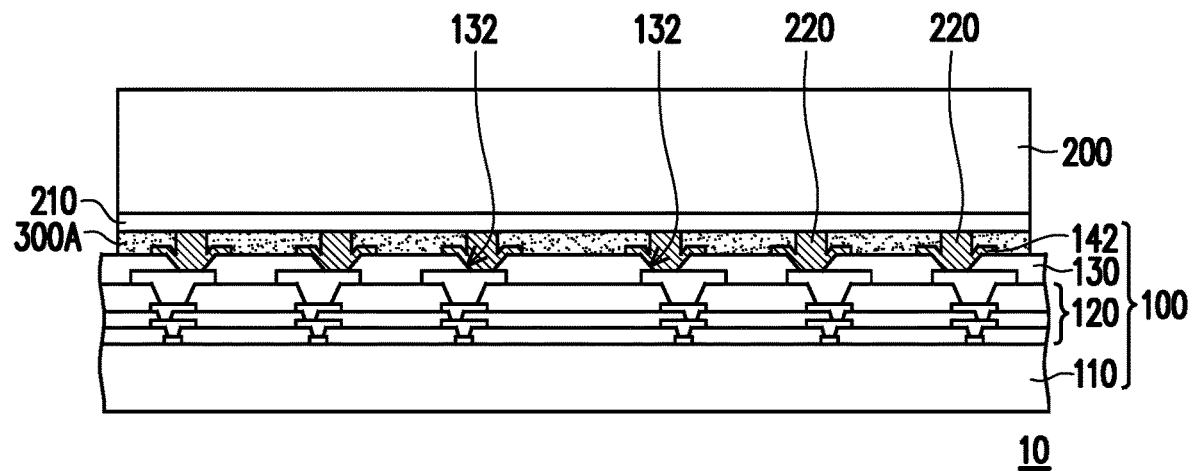

FIG. 2A and FIG. 2B are cross-sectional views illustrating a press-fitting process in the bonding method of the package structure according to an embodiment of the invention. After the first substrate 100 of FIG. 1G is completed, with reference to FIG. 2A, a second substrate 200 is provided. Then, a plurality of conductive pillars 220 are formed on the second substrate 200. In this embodiment, a planarization layer 210 is further disposed on the second substrate 200, and the planarization layer 210 is located between the second substrate 200 and the conductive pillars 220. The second substrate 200 may be, for example, a chip, a carrier or an electronic device, but the invention is not limited thereto. The conductive pillars 220 may be plating bumps or wire bumps, which are made of the same material as the pads 142 that includes a metal material. The metal material may be, for example, titanium, copper, nickel, palladium, gold, silver or alloys thereof.

Next, an adhesive layer 300A is disposed between the first substrate 100 and the second substrate 200. Here, it should be noted that, the adhesive layer 300A depicted in FIG. 2A and the adhesive layer 300' of FIG. 1H may be made of the same material to provide the similar effects. In this embodiment, the adhesive layers 300A and 300' may be made of one of a non-photosensitive adhesive or a photosensitive adhesive. The non-photosensitive adhesive includes an acrylic resin, polyimide (PI), polybenzoazole (PBO), silicone, epoxy, benzocyclobutene (BCB) and the like. The adhesive layers 300' and 300A may be adjusted by users based on design requirements, rather than being limited to be formed on the first substrate 100 or the second substrate 200 in advance. The following description is provided with the adhesive layer 300A formed on the second substrates 200 as an example.

In this embodiment, the adhesive layer 300A is a film layer covering the second substrate 200 and the conductive pillars 220. In detail, the adhesive layer 300A covers the conductive pillars 220 and fills the gaps between the conductive pillars 200, but the invention is not limited thereto. Afterwards, the conductive pillars 200 are aligned with the pads 124.

Then, with reference to FIG. 2B, the conductive pillars 200 are press-fitted to the pads 142 such that each of the conductive pillars 220 electrically connects each of the pads 142 and fills each of the vias 132. After the press-fitting process, the conductive pillars 200 may fill the vias 132 and complete an electrical connection with the pads 142. The adhesive layer 300A may fill the gaps between the first substrate 100 and the second substrate 200 and fill the gaps between the conductive pillars 220. Therefore, sealing protection may be achieved for the conductive pillars 220 and the pads 142, and favorable bonding strength and bonding quality may be provided for the first substrate 100 and the second substrate 200. Incidentally, after the press-fitting process, a portion of the adhesive layer 300A covering each of the conductive pillars 220 can substantially discharged from an intersection between each of the conductive pillars 220 and the respective pad 142. In this way, the adhesive layer 300A would not substantially affect the electrical connection between the conductive pillars 220 and the pads 142. So far, the bonding process of a package structure 10 is completed.

It should be noted that, in this embodiment, a bonding temperature may be less than 200° C. and the bonding process may be performed under normal pressure. In comparison with the conventional copper-to-copper bonding process, after the conductive pillars 220 are in contact with the pads 142 filling the vias 132, because a stress concentrator is produced between the conductive pillars 200 and the pads 142, the bonding temperature may be effectively reduced, and a strength required by the bonding process may also be reduced. In addition, before bonding, a surface of the conductive pillar 220 does not need to be cleaned in advance, nor does it need to be flattened by the chemical polishing process. Further, after bonding, the package structure 10 does not need to go through the additional annealing process. Therefore, the bonding method according to the present embodiment is suitable for reducing process requirements, reducing manufacturing cost and improving quality and reliability of the package structure 10.

In brief, the bonding method of the package structure 10 is capable of disposing the adhesive layer 300A between the first substrate 100 and the second substrate 200 before press-fitting the first substrate 100 to the second substrate 200. After bonding, the adhesive layer 300A may fill the gaps between the first substrate 100 and the second substrate 200 and fill the gaps between the conductive pillars 220. Therefore, under the premise of refining the contact points, sealing protection may be achieved for the conductive pillars 220 and the pads 142, and favorable bonding strength and bonding quality may be provided for the first substrate 100 and the second substrate 200. Moreover, during bonding, because the stress concentrator may be produced between the conductive pillars 220 and the pads 142 in contact, the process temperature and pressure for bonding may be effectively reduced to be suitable for the low temperature bonding assembly. Therefore, the package structure 10 of the invention is suitable for reducing process requirements, reducing manufacturing cost and improving quality and reliability of the package structure 10. Further, the conductive pillars 220 can fill the vias 132 and achieve favorable electrical connection with the pads 142 to allow the package structure 10 to provide favorable electrical property that further improves quality of the package structure 10.

Structurally, with reference to FIG. 2B, the package structure 10 of the present embodiment includes the first substrate 100, the second substrate 200 disposed opposite to the first substrate 100, the conductive pillars 220 and the adhesive layer 300A. In this embodiment, the first substrate 100 includes the via 132 and the pads 142. The pads 142 are disposed on the first substrate 100 and fill the vias 132. Each of the conductive pillars 220 electrically connects each of the pads 142 and the second substrate 200, and each of the conductive pillars 220 fills each of the vias 132. The adhesive layer 300A is disposed between the first substrate 100 and the second substrate 200, and fills the gaps between the conductive pillars 220.

In brief, the adhesive layer 300A of the package structure 10 of the invention can fill the gaps between the first substrate 100 and the second substrate 200 and fill the gaps between the conductive pillars 220. Therefore, under the premise of refining the contact points, sealing protection may be achieved for the conductive pillars 220 and the pads 142, and favorable bonding strength and bonding quality may be provided for the first substrate 100 and the second substrate 200. In addition, because the stress concentrator may be produced between the conductive pillars 220 and the pads 412 in contact, the process temperature and pressure for bonding may be effectively reduced to be suitable for the low temperature bonding assembly. Further, the conductive pillars 220 in contact with the pads 142 may fill the vias 132 and may achieve favorable electrical connection with the pads 142 to allow the package structure 10 to provide favorable electrical property that further improves quality of the package structure 10.

It should be noted that the reference numerals and a part of the contents in the previous embodiment are used in the following embodiments, in which identical reference numerals indicate identical or similar devices. The part of the description with the identical technical content omitted may refer to the foregoing embodiment, which is not repeated in the following description.

Figure 3A:
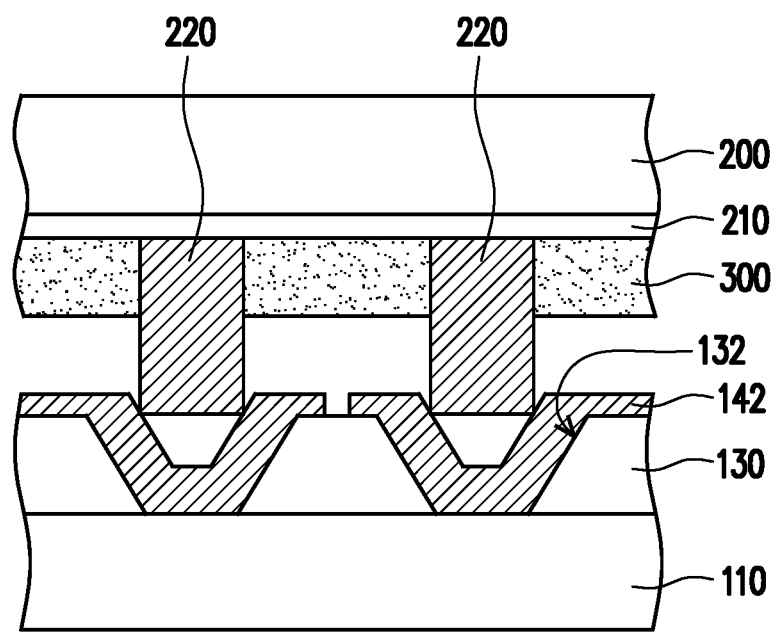
FIG. 3A is a partially-enlarged cross-sectional view illustrating the pad according to an embodiment of the invention.

FIG. 3A is a partially-enlarged cross-sectional view illustrating the pad according to an embodiment of the invention. Here, it should be noted that, what illustrated in FIG. 3 is a schematic diagram showing the conductive pillars 220 aligned with the pads 142 before the press-fitting process. In addition, for descriptive convenience, FIG. 3A only schematically illustrates that the first substrate 100 includes the first base 110 and the dielectric layer 130 with illustration of the circuit layer 120 omitted. Practically, the circuit layer 120 may be disposed or may not be disposed on the first base 110, and the invention is not limited thereto.

In this embodiment, an adhesive layer 300 does not cover the conductive pillar 220. Specifically, the adhesive layer 300 surrounds the conductive pillars 220 and fills the gaps between the conductive pillars 220, but the invention is not limited thereto. A wall surface of each of the vias 132 is an inclined surface, and an aperture of each of the vias 132 is smallest at an intersection with the first base 110, and the aperture gradually increases towards a position on the patterned dielectric layer 130 close to the second substrate 200 (i.e. the vias 132 are taper shaped), but the invention is not limited thereto.

In this embodiment, the pad 142 is formed from a portion of the metal interfacial layer 140 (illustrated in FIG. 1F) being exposed through the electroplating process or the chemical plating process to be conformal with the vias 132. For instance, the pads 142 conformally cover a portion of the patterned dielectric layer 130 and fill the vias 132. The pad 142 has a portion filling the via 132 and another portion covering a surface of the dielectric layer 130, but the invention is not limited thereto.

With the above design, because the stress concentrator may be produced between the conductive pillar 220 and the pads 142 in contact, the process temperature and pressure for bonding may be effectively reduced to be suitable for the low temperature bonding assembly. In addition, the adhesive layer 300 of the invention is disposed between the first substrate 100 and the second substrate 200. Therefore, after the subsequent press-fitting process, under the premise of refining the contact points, sealing protection may be achieved for the conductive pillars 220 and the pads 142, and favorable bonding strength and bonding quality may be provided for the first substrate 100 and the second substrate 200 so as to provide favorable electrical property.

Figure 3B:
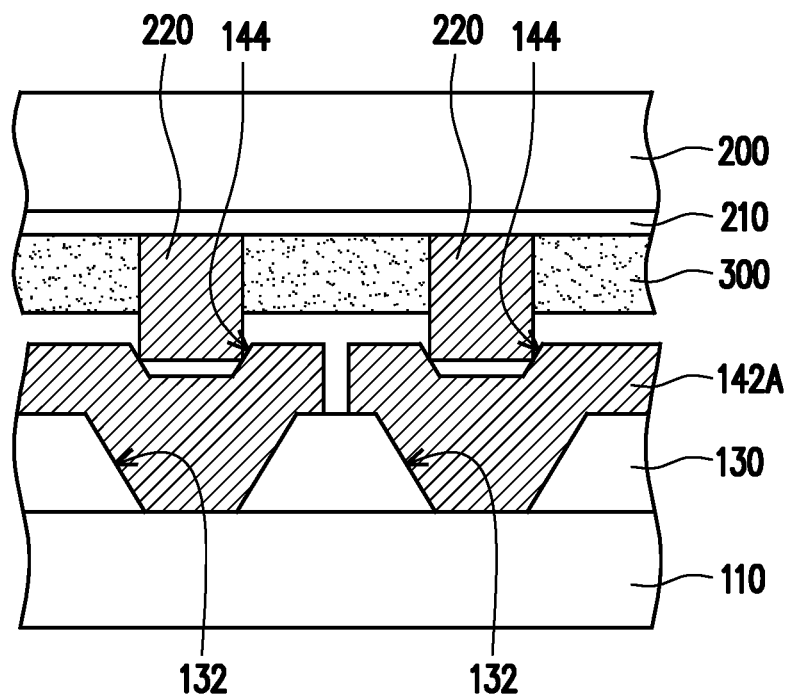
FIG. 3B is a partially-enlarged cross-sectional view illustrating the pad according to another embodiment of the invention.

FIG. 3B is a partially-enlarged cross-sectional view illustrating the pad according to another embodiment of the invention. With reference to FIG. 3A and FIG. 3B, pads 142A of the present embodiment are similar to the pads 142 of FIG. 3A, and the main difference is that each of the pads 142A has a dimple (dimple) 144, and each of the conductive pillars 220 electrically connects each of the dimples 144. For instance, the method of forming the dimples 144 includes the following steps. First, blocky pads (not illustrated) are formed through the electroplating process or the chemical plating process. Next, the pads 142A having the dimples 144 are formed by patterning the block pads through the etching process. In this embodiment, each of the dimples 144 may be formed corresponding to each of the vias 132, but the invention is not limited thereto. Each of the conductive pillars 220 may be aligned with the corresponding dimple 144, and may electrically connect the corresponding dimple 144. With the above design, the pads 142A of the present embodiment may achieve the substantially identical effects described in the foregoing embodiments.

Figure 3C:
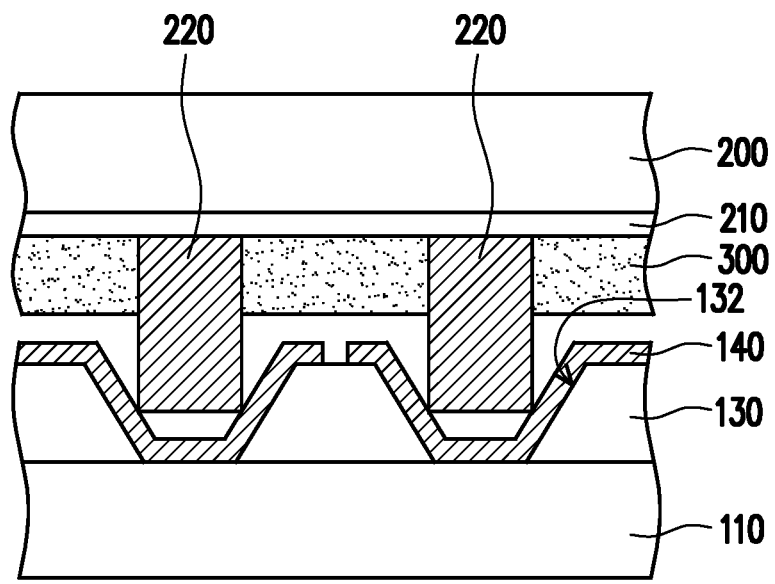
FIG. 3C is a partially-enlarged cross-sectional view illustrating the metal interfacial layer according to another embodiment of the invention.

FIG. 3C is a partially-enlarged cross-sectional view illustrating the metal interfacial layer according to another embodiment of the invention. With reference to FIG. 3A and FIG. 3C, the metal interfacial layer 140 of the present embodiment is similar to the pad 142 of FIG. 3A, and the main difference is that a portion of the metal interfacial layer 140 being exposed is directly used as the pads without going through the electroplating process or the chemical plating process, and the metal interfacial layer 140 is conformal with the vias 132. With the above design, the metal interfacial layer 140 of the present embodiment may achieve the substantially identical effects described in the foregoing embodiments.

Figure 3D:
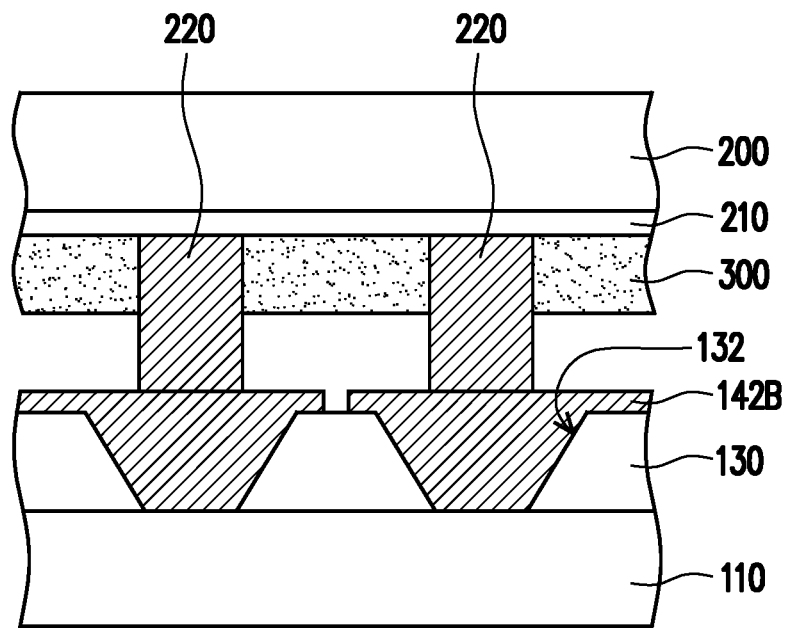
FIG. 3D is a partially-enlarged cross-sectional view illustrating the pad according to another embodiment of the invention.

FIG. 3D is a partially-enlarged cross-sectional view illustrating the pad according to another embodiment of the invention. With reference to FIG. 3A and FIG. 3D, pads 142B of the present embodiment are similar to the pads 142 of FIG. 3A, and the main difference is that the pads 142B disposed on the first base 110 is a pattered film layer disposed on the dielectric layer 130 that fills the vias 132. The pad 142B has a flat surface. For instance, a method of forming the pads 142B includes a physical vapor deposition, a chemical vapor deposition, an electroplating process or a chemical plating process. The physical vapor deposition may be, for example, a sputtering deposition or a vapor deposition. Each of the conductive pillars 220 is pushed against the flat surface of the pad 142B and electrically connects the pad 142B. With the above design, the conductive pillars 220 and the pads 142B may be directly press-fitted without going through the alignment to further reduce the process requirements.

Figure 4A:
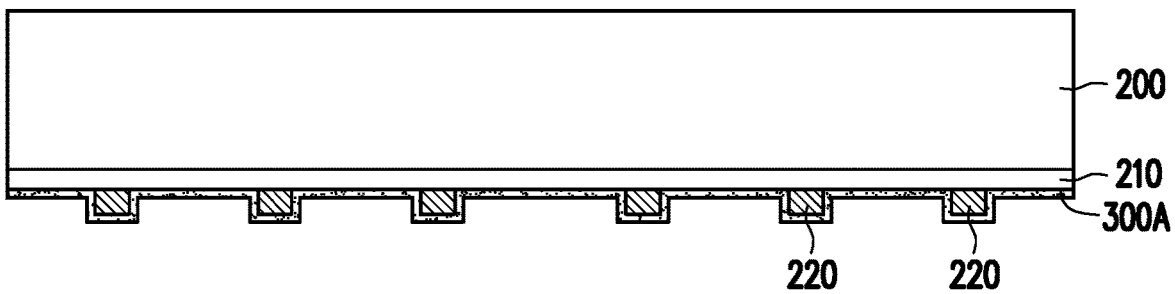
FIG. 4A is a cross-sectional view illustrating the adhesive layer according to an embodiment of the invention.

FIG. 4A is a cross-sectional view illustrating the adhesive layer according to an embodiment of the invention. In this embodiment, the conductive pillars 220 are formed on the second substrate 200, and the planarization layer 210 is further located between the second substrate 200 and the conductive pillars 220. The adhesive layer 300A is disposed on the planarization layer 210. The adhesive layer 300A includes a non-photosensitive adhesive. The non-photosensitive adhesive includes epoxy, an acrylic resin, polyimide (PI), polybenzoazole (PBO), silicone, epoxy, benzocyclobutene (BCB) and the like. In this embodiment, the adhesive layer 300A may be an underfill layer conformally covering the conductive pillars 220 and the second substrate 200 and filling the gaps between the conductive pillars 220. With the above design, the adhesive layer 300A of the present embodiment is disposed between the first substrate 100 and the second substrate 200 and fills the gaps between the conductive pillars 220. Therefore, after the subsequent press-fitting process, under the premise of refining the contact points, sealing protection may be achieved for the contact points (e.g., the conductive pillars and the pads), and favorable bonding strength and bonding quality may be provided for the substrates so as to provide favorable electrical property.

Figure 4B:
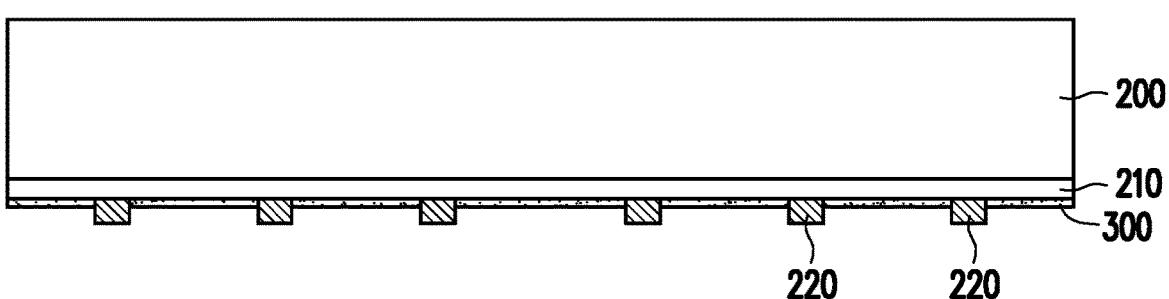
FIG. 4B is a cross-sectional view illustrating the adhesive layer according to another embodiment of the invention.

FIG. 4B is a cross-sectional view illustrating the adhesive layer according to another embodiment of the invention. With reference to FIG. 4A and FIG. 4B, the adhesive layer 300 of the present embodiment is similar to the adhesive layer 300A of FIG. 4A, and the main difference is that the adhesive layer 300 does not cover the conductive pillars 220. Specifically, the adhesive layer 300 surrounds the conductive pillars 220 and fills the gaps between the conductive pillars 220. With the above design, the adhesive layer 300 of the present embodiment may achieve the substantially identical effects described in the foregoing embodiments.

Figure 4C:
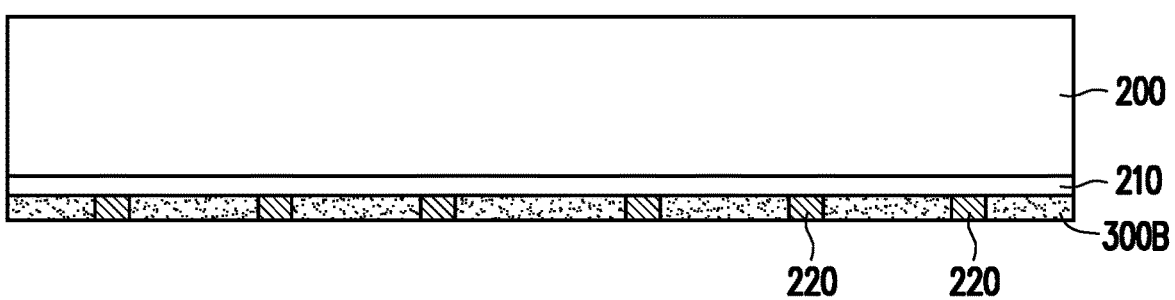
FIG. 4C is a cross-sectional view illustrating the adhesive layer according to another embodiment of the invention.

FIG. 4C is a cross-sectional view illustrating the adhesive layer according to another embodiment of the invention. With reference to FIG. 4A and FIG. 4C, an adhesive layer 300B of the present embodiment is similar to the adhesive layer 300A of FIG. 4A, and the main difference is that the adhesive layer 300B does not cover the conductive pillars 220. Specifically, the adhesive layer 300B surrounds the conductive pillars 220, fills the gaps between the conductive pillars 220 and is coplanar with the conductive pillars 220. With the above design, the adhesive layer 300B of the present embodiment may achieve the substantially identical effects described in the foregoing embodiments.

Figure 4D:
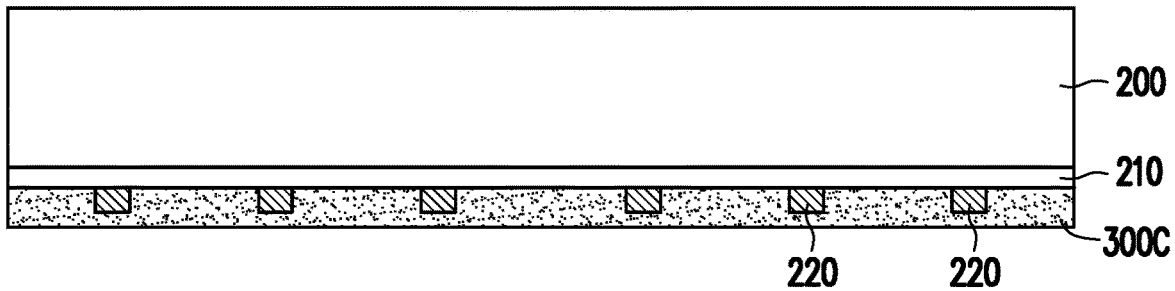
FIG. 4D is a cross-sectional view illustrating the adhesive layer according to another embodiment of the invention.

FIG. 4D is a cross-sectional view illustrating the adhesive layer according to another embodiment of the invention. With reference to FIG. 4A and FIG. 4D, an adhesive layer 300C of the present embodiment is similar to the adhesive layer 300A of FIG. 4A, and the main difference is that the adhesive layer 300C does not conformally cover the conductive pillars 220. Specifically, the adhesive layer 300C completely covers the conductive pillars 220 and fills the gaps between the conductive pillars 220. Also, a thickness of the adhesive layer 300C is greater than a thickness of the conductive pillar 220. With the above design, the adhesive layer 300C of the present embodiment may achieve the substantially identical effects described in the foregoing embodiments.

Figure 5:
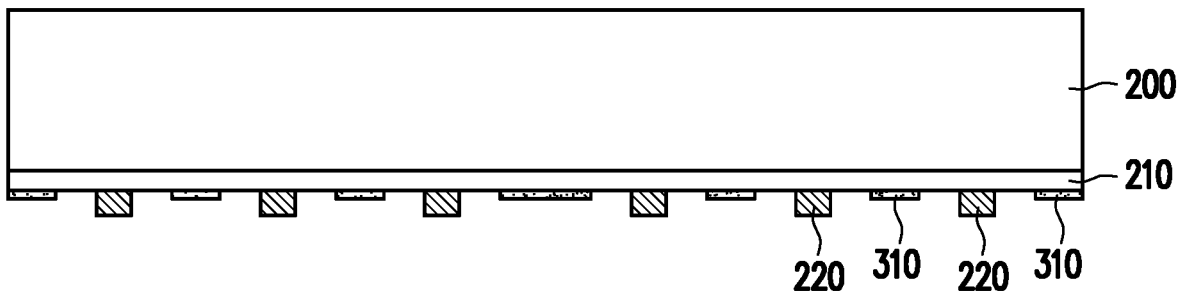
FIG. 5 is a cross-sectional view illustrating the adhesive layer according to yet another embodiment of the invention.

FIG. 5 is a cross-sectional view illustrating the adhesive layer according to yet another embodiment of the invention. With reference to FIG. 4A and FIG. 5, an adhesive layer 310 of the present embodiment is similar to the adhesive layer 300A of FIG. 4A, and the main difference is that the adhesive layer 310 does not cover the conductive pillars 220. Specifically, the adhesive layer 310 is disposed on the second substrate 200, surrounds the conductive pillars 220 and fills the gaps between the conductive pillars 220. In this embodiment, the adhesive layer 310 includes a photosensitive adhesive. The photosensitive adhesive includes epoxy, an acrylic resin, polyimide (PI), polybenzoazole (PBO), silicone, epoxy, benzocyclobutene (BCB) and the like. A method of forming the adhesive layer 310 includes the following steps. An adhesive material (not illustrated) is disposed to cover the conductive pillars 220 and the second substrate 200. Next, a patterned masking layer (not illustrated) is formed on the adhesive material. Afterwards, a photolithography process is performed with the patterned masking layer as the mask to pattern the adhesive layer 310, and the unnecessary adhesive material covering the conductive pillars 220 and the adhesive material partially surrounding and in contact with the conductive pillars 220 are removed. With the above design, other than achieving the identical effects described in the foregoing embodiments by the adhesive layer 310 of the present embodiment, the unnecessary adhesive material may further be removed to reduce interference on the electrical connection of the contact points (e.g., the conductive pillars and the pads) so as to provide favorable electrical property.

Figure 6:
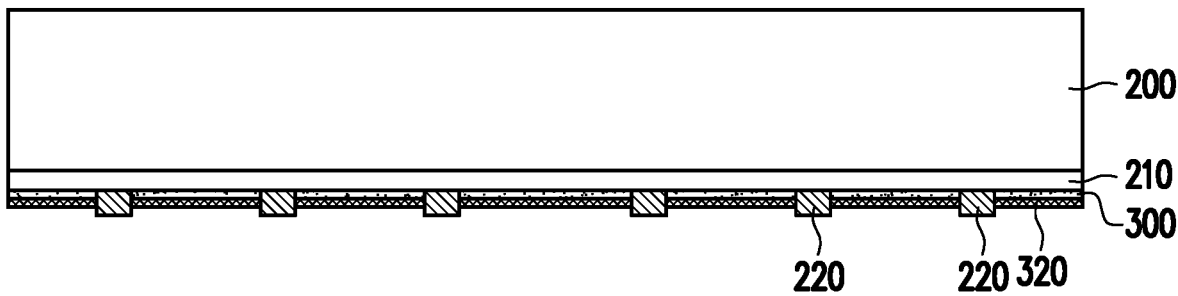
FIG. 6 is a cross-sectional view illustrating the second substrate according to another embodiment of the invention.

FIG. 6 is a cross-sectional view illustrating the second substrate according to another embodiment of the invention. With reference to FIG. 4B and FIG. 6, in the second substrate 200 of the present embodiment, a macromolecular adhesive layer 320 is further disposed on the adhesive layer 300. In this embodiment, the adhesive layer 300 includes a non-photosensitive adhesive, but the invention is not limited thereto. In other embodiments, the adhesive layer 300 may also be a photosensitive adhesive. The adhesive layer 300 is disposed on the second substrate 200, surrounds the conductive pillars 220 and fills the gaps between the conductive pillars 220. The macromolecular adhesive layer 320 overlaps with the adhesive layer 300 and fills the gaps between the conductive pillars 220. In this embodiment, the macromolecular adhesive layer 320 is an adhesive using the molecular bonding technology (MBT). In detail, the macromolecular adhesive layer 320 is a polymer having a buffer layer mixed with a nano bonding material that includes a silane coupling agent polymer. Since the macromolecular adhesive layer 320 is not adhesive to the metal material and has favorable adhesion to the non-metal material, the macromolecular adhesive layer 320 can cover the entire surface of the adhesive layer 300 and the conductive pillars 220 through a coating method or a spraying method. With the above design, because the macromolecular adhesive layer 320 of the present embodiment can be disposed in a simple manner and does not cover the conductive pillars 220, the macromolecular adhesive layer 320 is suitable for reducing the process requirements. In addition, since the macromolecular adhesive layer 320 does not affect the conductive pillars 220, interference on the electrical connection of the contact points (e.g., the conductive pillars and the pads) may be reduced to provide favorable electrical property.

Figure 7:
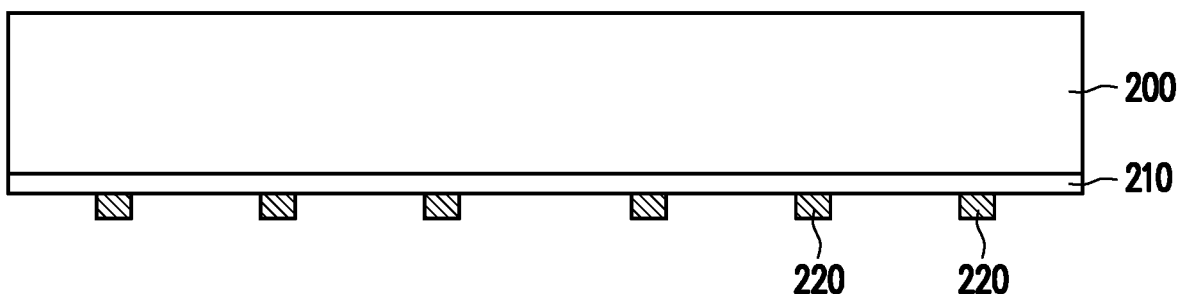
FIG. 7 is a cross-sectional view illustrating the second substrate according to yet another embodiment of the invention.

FIG. 7 is a cross-sectional view of the second substrate according to yet another embodiment of the invention. With reference to FIG. 1H and FIG. 7, the adhesive layer or the macromolecular adhesive layer is not included on the second substrate 200 of the present embodiment, and instead, the adhesive layer 300' (illustrated in FIG. 1H) is disposed on the first substrate 100. With the above design, the second substrate 200 of the present embodiment may press-fit onto the adhesive layer 300' disposed on the first substrate 100 may achieve the substantially identical effects described in the foregoing embodiments.

In summary, with the package structure and the bonding method thereof according to the invention, the adhesive layer may be disposed between the first substrate and the second substrate before press-fitting the first substrate to the second substrate. After bonding, the adhesive layer may fill the gaps between the first substrate and the second substrate and fill the gaps between the conductive pillars. Therefore, under the premise of refining the contact points, sealing protection may be achieved for the conductive pillars and the pads, and favorable bonding strength and bonding quality may be provided for the first substrate and the second substrate. Moreover, during bonding, because a stress concentrator may be produced between the conductive pillar and the pad in contact, process temperature and pressure for bonding may be effectively reduced to be suitable for the low temperature bonding assembly. In comparison with the conventional bonding technique, with use of the bonding method of the package structure, the conductive pillar of the substrate does not need to be cleaned in advance, nor does it need to be flattened by the chemical polishing process. Further, after bonding, the package structure does not need to go through the additional annealing process. Therefore, the bonding method according to the invention is suitable for reducing the process requirements, reducing manufacturing cost and improving quality and reliability of the package structure. Further, the conductive pillars can fill the vias and achieve favorable electrical connection with the pads to allow the package structure to provide favorable electrical property that further improves quality of the package structure. Moreover, the package structure of the invention may also include the macromolecular adhesive layer to further provide favorable bonding strength and reduce interference on the electrical connection of the contact points. As a result, favorable electric property may be provided to further improve quality of the package structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
a first substrate, comprising:
a dielectric layer;
a plurality of vias disposed in the dielectric layer; and
a plurality of pads, disposed on the dielectric layer and extending inside the vias, wherein the pads are disposed on sidewalls of the vias;
a second substrate, disposed opposite to the first substrate;
a plurality of conductive pillars disposed on the second substrate, each of the conductive pillars electrically connecting each of the pads and the second substrate, each of the conductive pillars being disposed in each of the vias, wherein each of the pads and each of the conductive pillars together fully fill each of the corresponding vias; and
an adhesive layer, disposed between the first substrate and the second substrate, the adhesive layer filling gaps between the conductive pillars.

2. The package structure according to claim 1, wherein each of the pads is conformal with each of the vias.

3. The package structure according to claim 1, wherein each of the pads has a dimple, and each of the conductive pillars electrically connects each of the dimples.

4. The package structure according to claim 1, wherein the adhesive layer comprises one of a non-photosensitive adhesive or a photosensitive adhesive.

5. The package structure according to claim 4, further comprising:
a planarization layer, disposed on the second substrate, the planarization layer being located between the second substrate and the conductive pillars; and
a macromolecular adhesive layer, disposed on the adhesive layer, the macromolecular adhesive layer filling the gaps between the conductive pillars.

6. A bonding method of a package structure, comprising:
providing a first substrate, and forming a plurality of vias in a dielectric layer of the first substrate;
disposing a plurality of pads on the dielectric layer, each of the pads extending inside each of the vias, wherein the pads are disposed on sidewalls of the vias;
providing a second substrate, and forming a plurality of conductive pillars on the second substrate;
disposing an adhesive layer between the first substrate and the second substrate, the adhesive layer filling gaps between the conductive pillars; and
press-fitting the conductive pillars to the pads such that each of the conductive pillars electrically connects each of the pads and is disposed in each of the vias, wherein each of the pads and each of the conductive pillars together fully fill each of the corresponding vias.

7. The bonding method of the package structure according to claim 6, wherein the step of forming the vias in the dielectric layer of the first substrate comprises:
providing a first base and forming a dielectric material on the first base; and patterning the dielectric material to form the dielectric layer having the vias, and exposing a portion of the first base.

8. The bonding method of the package structure according to claim 7, wherein the step of disposing the pads on the dielectric layer comprises:

forming a metal interfacial layer on the dielectric layer filling the vias;

forming a patterned passivation layer covering the metal interfacial layer, and exposing a portion of the metal interfacial layer filling the vias;

forming the pads from the portion of the metal interfacial layer being exposed; and removing the patterned passivation layer and the metal interfacial layer covered by the patterned passivation layer.

9. The bonding method of the package structure according to claim 8, further comprising:

forming a dimple on each of the pads, each of the conductive pillars electrically connecting each of the dimples.

10. The bonding method of the package structure according to claim 6, further comprising:

disposing a planarization layer on the second substrate, the planar layer being located between the second substrate and the conductive pillars; and disposing a macromolecular adhesive layer on the adhesive layer, the macromolecular adhesive layer filling the gaps between the conductive pillars.

* * * * *